(12) United States Patent
Nomura

(10) Patent No.: US 12,216,181 B2
(45) Date of Patent: Feb. 4, 2025

(54) INFORMATION PROCESSING APPARATUS CAPABLE OF DATA COMMUNICATION AND CONTROL METHOD THEREFOR

(71) Applicant: CANON KABUSHIKI KAISHA, Tokyo (JP)

(72) Inventor: Yoshihisa Nomura, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 17/746,421

(22) Filed: May 17, 2022

(65) Prior Publication Data

US 2022/0373615 A1 Nov. 24, 2022

(30) Foreign Application Priority Data

May 21, 2021 (JP) .................. 2021-086105

(51) Int. Cl.
*G01R 31/58* (2020.01)
*G01R 29/08* (2006.01)
*G01R 31/08* (2020.01)

(52) U.S. Cl.
CPC ........... *G01R 31/58* (2020.01); *G01R 29/085* (2013.01); *G01R 31/08* (2013.01)

(58) Field of Classification Search
CPC ...... G01R 31/58; G01R 29/085; G01R 31/08; H04B 3/02; H04B 3/46
See application file for complete search history.

(56) References Cited

U.S. PATENT DOCUMENTS

2016/0202643 A1* 7/2016 Nakajima .......... G03G 15/1665
399/9
2019/0013621 A1* 1/2019 Buhlman ............. H01R 13/641

FOREIGN PATENT DOCUMENTS

JP 5861134 B1 2/2016

* cited by examiner

*Primary Examiner* — Feba Pothen
(74) *Attorney, Agent, or Firm* — ROSSI, KIMMS & McDOWELL LLP

(57) ABSTRACT

An information processing apparatus capable of preventing erroneous connection at a time of connection using cables without deteriorating versatility. The information processing apparatus is communicable with an external device via two cables. A first connector is connected to one of the two cables and has terminals, which include a first terminal that is arranged at a first position and receives a predetermined signal output according to start-up of the external device. A second connector of a same shape as the first connector is connected to another of the two cables and that has terminals, which are identical to the terminals of the first connector in number and arrangement and include a second terminal that is not used to output a signal and is arranged at a position corresponding to the first terminal. A controller notifies of an error through a notification device when the second terminal receives the predetermined signal.

9 Claims, 8 Drawing Sheets

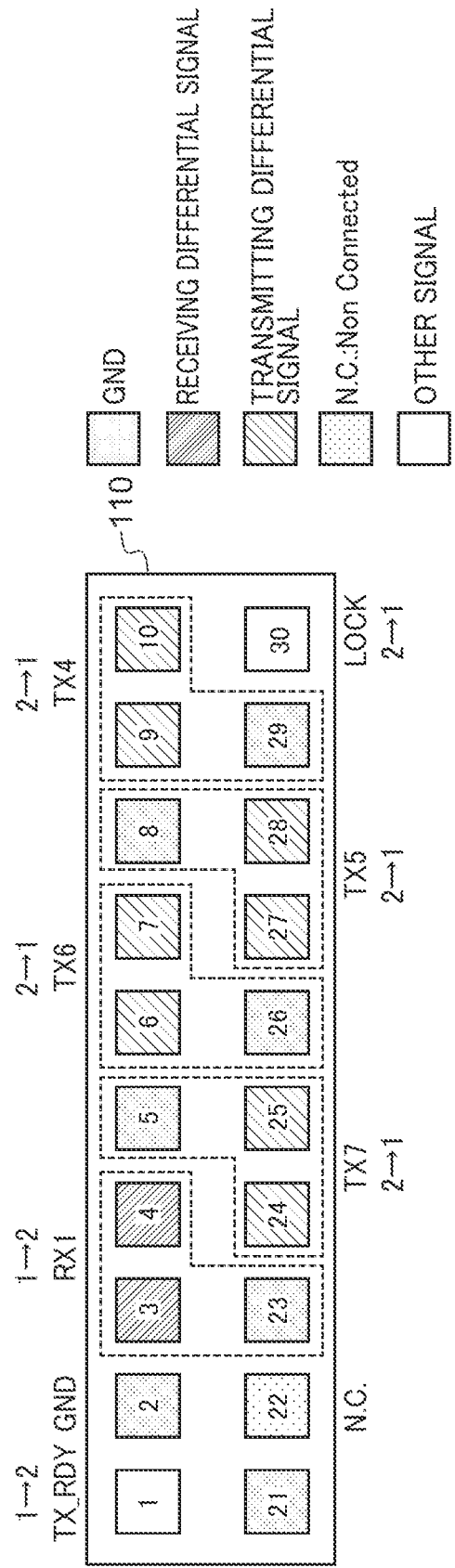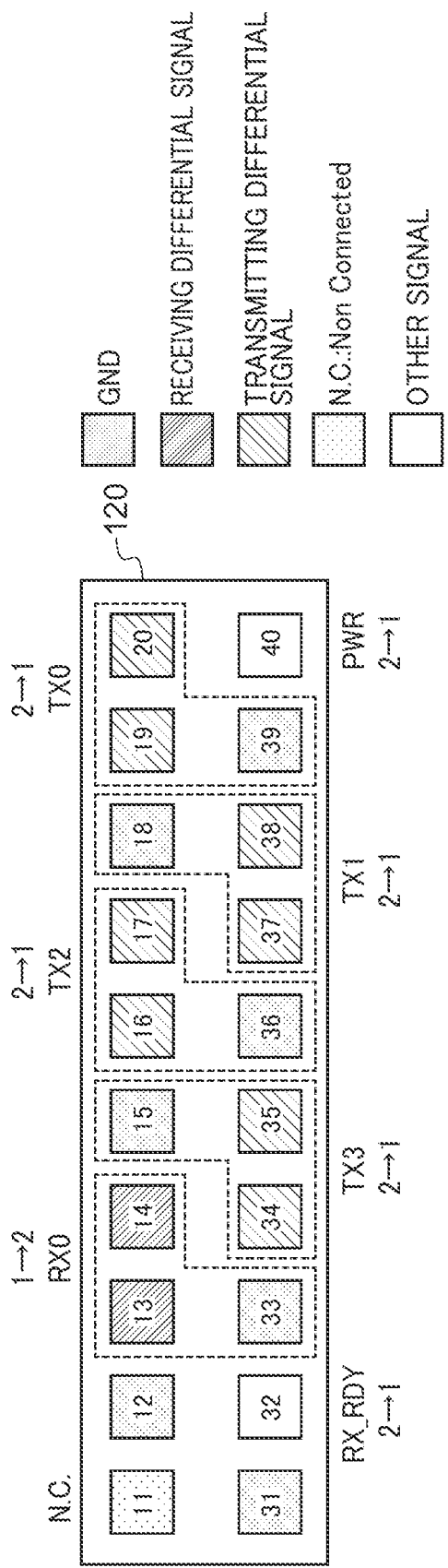

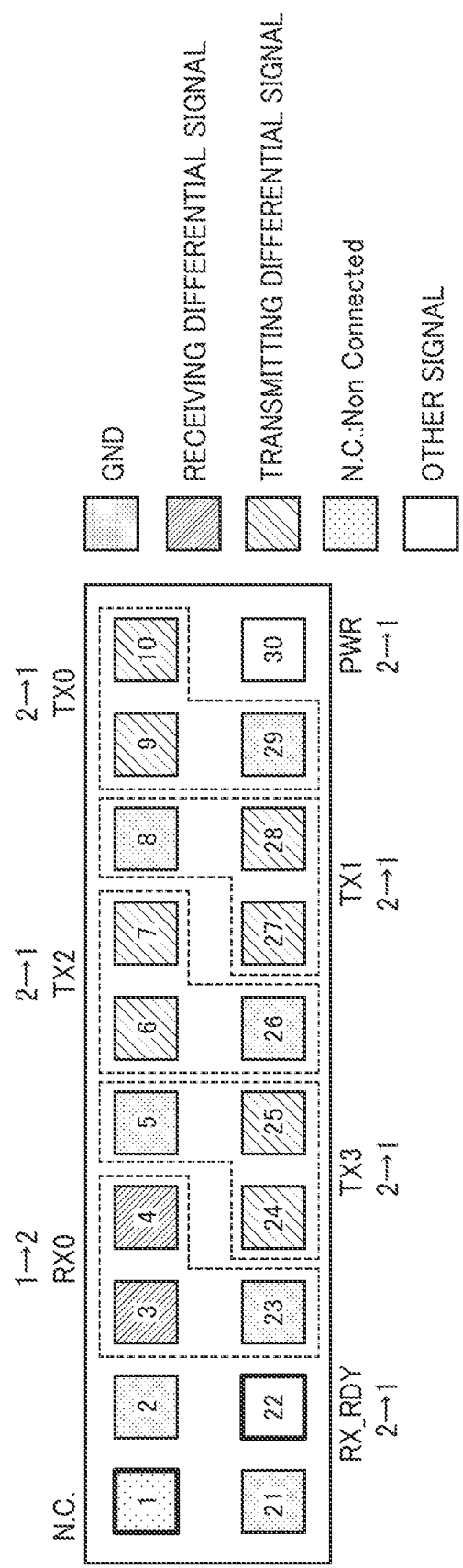
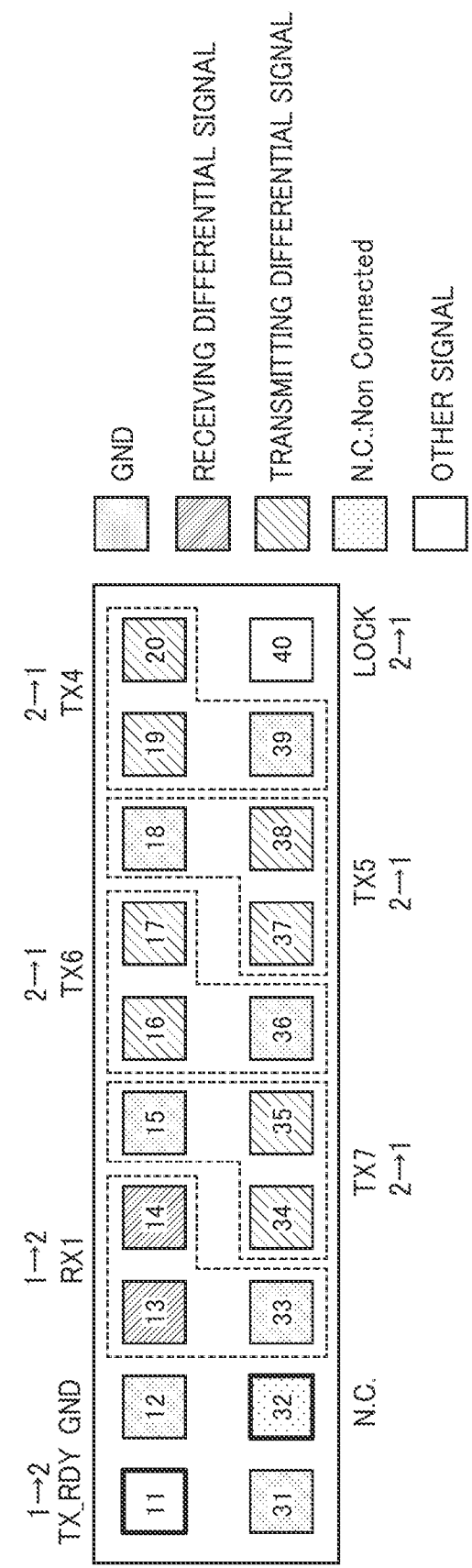

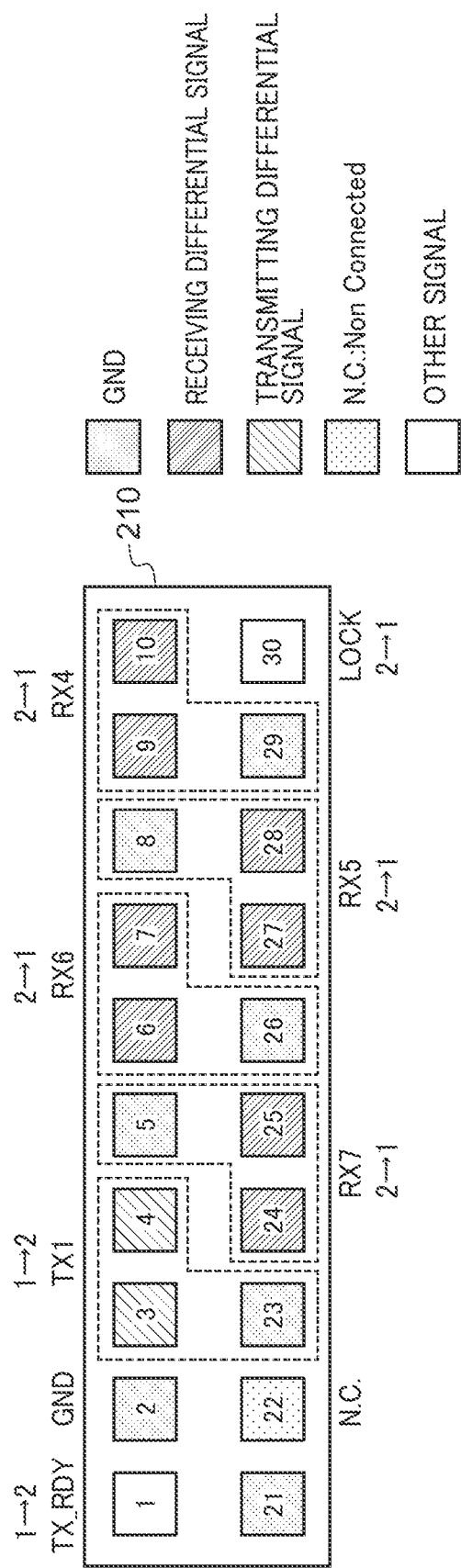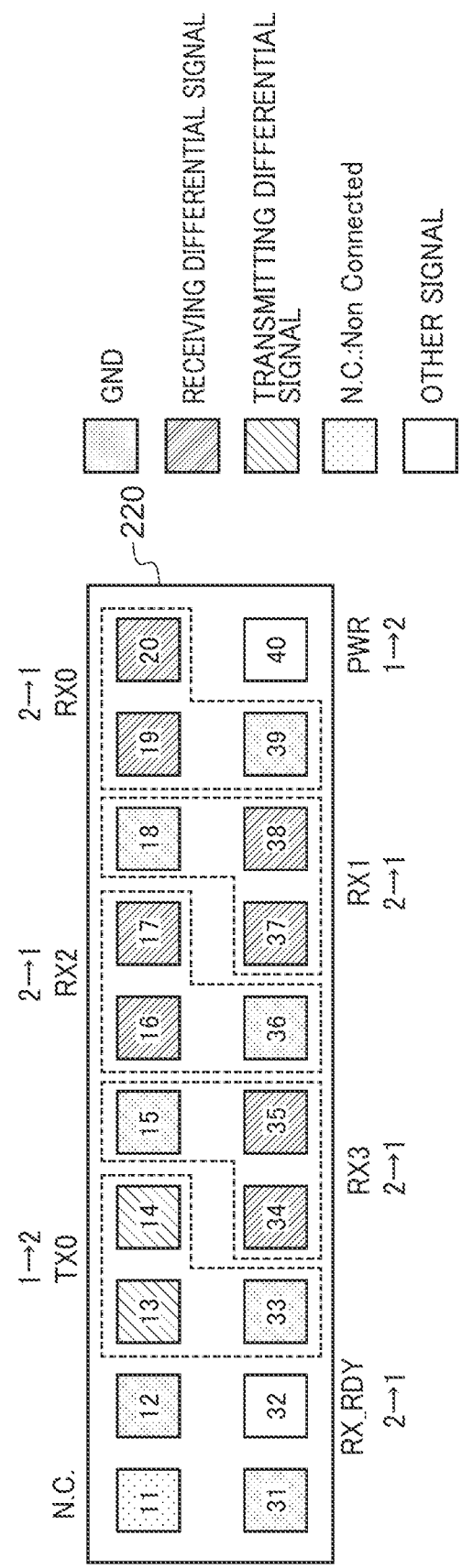

INFORMATION PROCESSING APPARATUS CAPABLE OF DATA COMMUNICATION AND CONTROL METHOD THEREFOR

BACKGROUND OF THE INVENTION

Field of the Invention

The present invention relates to an information processing apparatus capable of data communication and a control method therefor.

Description of the Related Art

Due to increase in an amount of data treated by an information processing apparatus and acceleration of processing speed, a data amount transmitted between information processing apparatuses connected communicably tends to increase. This requires high communication speed between information processing apparatuses. In view of such a requirement, counterplans, such as increase of a bus width and high-frequency data transmission with serialization of a bus, are employed inside an information processing apparatus.

In the meantime, when information processing apparatuses are connected through a cable, it is necessary to increase the number of signal lines (electric lines) in the cable. However, from a viewpoint of securing signal quality, there is an upper limit of a communication frequency in communication using a cable. Moreover, when the number of signal lines is increased, a diameter of the entire cable increases and physical manipulation becomes difficult due to decrease of flexibility.

Consequently, it may be preferable to perform the data communication between information processing apparatuses using a plurality of cables. However, when information processing apparatuses are connected using a plurality of cables, there is a possibility that poor communication, such as lack of data transmission, occurs due to mismatching of signal directions of the cables or an erroneous insertion of a connector (erroneous connection). In view of the problem, Japanese Patent Publication No. 5861134 suggests a technique that information processing apparatuses of a transmitting side and receiving side respectively inspect connection states of cables when the cables are installed or replaced.

When information processing apparatuses are connected through a plurality of cables, it is available to prevent erroneous connection by changing connector shapes. However, in that case, since an information processing apparatus is required to provide connectors of different shapes and it is necessary to prepare cables having different connector shapes, versatility will be lowered. Moreover, the technique disclosed in the above-mentioned publication causes time and effort to inspect connection states of cables.

SUMMARY OF THE INVENTION

The present invention provides a technique to prevent erroneous connection at a time of connecting information processing apparatuses using a plurality of cables without deteriorating versatility.

Accordingly, an aspect of the present invention provides an information processing apparatus capable of communicating with an external device via two cables. The information processing apparatus includes a first connector that is connected to one of the two cables and that has terminals, which include a first terminal that is arranged at a first position and receives a predetermined signal output according to start-up of the external device and are arranged in a predetermined arrangement, a second connector of a same shape as the first connector that is connected to another of the two cables and that has terminals, which are identical to the terminals of the first connector in number and arrangement and include a second terminal that is not used to output a signal and is arranged at a position corresponding to the first terminal, a notification device configured to notify of information, and at least one controller configured to notify of an error through the notification device in a case where the second terminal receives the predetermined signal.

According to the present invention, the erroneous connection at a time of connecting information processing apparatuses using a plurality of cables can be prevented without deteriorating versatility.

Further features of the present invention will become apparent from the following description of exemplary embodiments with reference to the attached drawings.

BRIEF DESCRIPTION OF THE DRAWINGS

FIG. 2A and FIG. 2B are schematic views showing terminal arrangements of connectors of a first information processing apparatus shown in FIG. 1 and signals allocated to terminals.

FIG. 4A and FIG. 4B are views showing relations between terminals and signals of the connectors of the first information processing apparatus viewed from a second information processing apparatus in a case where the cables are erroneously connected.

FIG. 6A and FIG. 6B are schematic views showing terminal arrangements of connectors of a second information processing apparatus and signals allocated to terminals.

DESCRIPTION OF THE EMBODIMENTS

Figure 1:
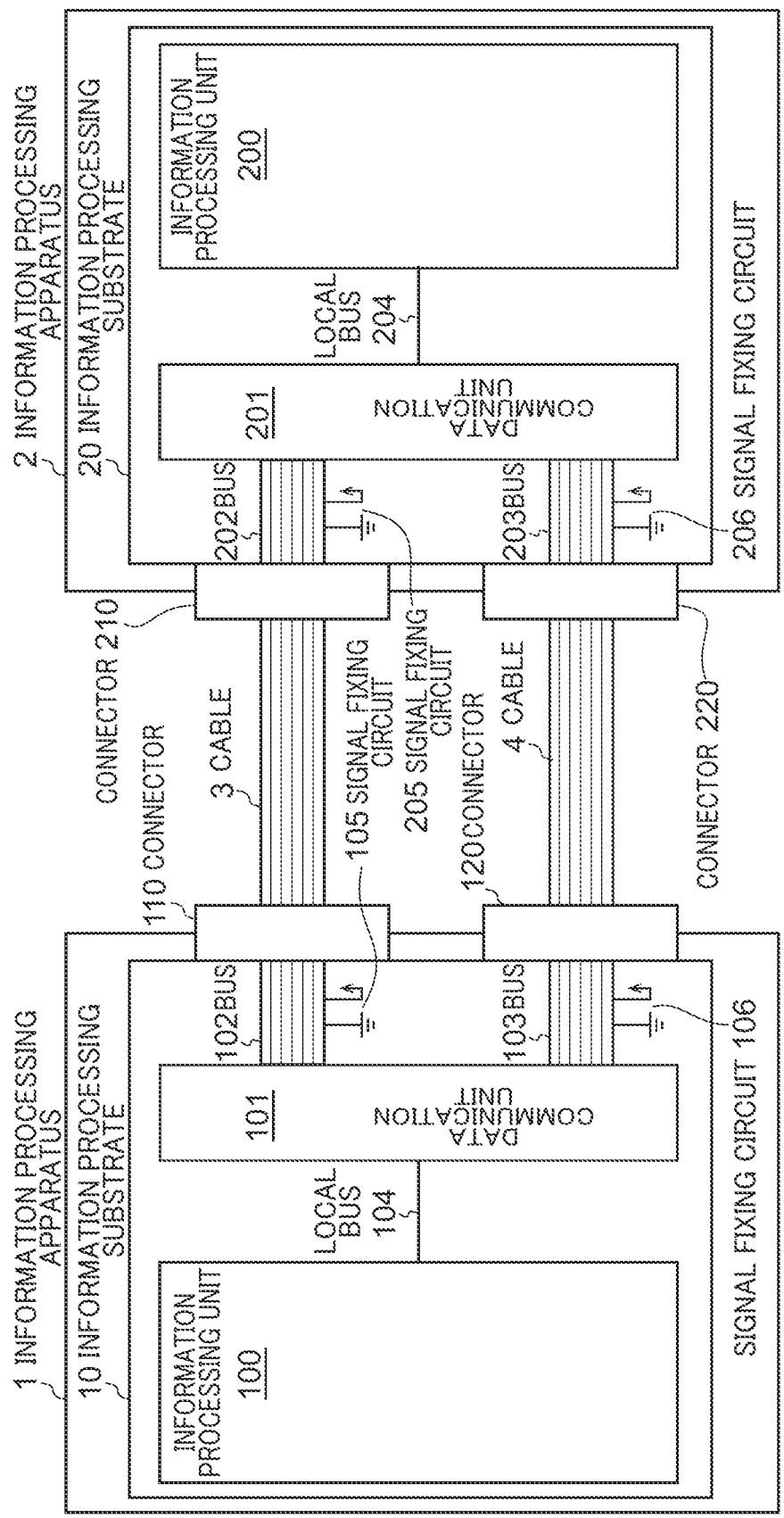
FIG. 1 is a block diagram schematically showing a configuration of an image processing system according to an embodiment of the present invention.

Hereafter, embodiments according to the present invention will be described in detail by referring to the drawings.

FIG. 1 is a block diagram schematically showing a configuration of an image processing system according to an embodiment of the present invention. The information processing system is constituted by connecting an information processing apparatus 1 (a first information processing apparatus) and an information processing apparatus 2 (a second information processing apparatus) through cables 3 and 4 so as to enable bidirectional communication. The image forming apparatus 1 is a personal computer, a server, or the like and the information processing apparatus 2 is an image forming apparatus, such as a multifunction apparatus (MFP). However, the information processing apparatuses 1 and 2 may be other apparatuses. In the following description, the information processing apparatus 1 shall be a computer and the information processing apparatus 2 shall be an MFP.

The information processing apparatus 1 has an information processing unit 100, a data communication unit 101, buses 102 and 103, a local bus 104, signal fixing circuits 105 and 106, and connectors 110 and 120. Similarly, the information processing apparatus 2 has an information processing unit 200, a data communication unit 201, buses 202 and 203, a local bus 204, signal fixing circuits 205 and 206, and connectors 210 and 220.

The information processing unit 100 and the data communication unit 101 are respectively implemented in an information processing substrate 10 by predetermined circuit configurations. Moreover, the information processing unit 200 and the data communication unit 201 are respectively implemented in an information processing substrate 20 by predetermined circuit configurations. For example, the information processing units 100 and 200 and the data communication units 101 and 201 are constituted as semiconductor chips, respectively. In the meantime, the information processing unit 100 and the data communication unit 101 may consist of a single semiconductor chip. Similarly, the information processing unit 200 and the data communication unit 201 may consist of a single semiconductor chip.

The information processing unit 100 has a CPU that performs an arithmetic process, a ROM that stores programs and data, a RAM that has an area storing temporary data and a workspace to which a program is developed, etc. The information processing unit 100 performs various information processes mentioned later when the CPU executes a predetermined program that is read from the ROM and is developed to the RAM. The information processing unit 200 is configured in proportion to the information processing unit 100 and performs information processes in the information processing apparatus 2. For example, the information processing unit 100 performs a process that transmits image data in a bitmap format to the information processing apparatus 2. And the information processing unit 200 receives the image data transmitted from the information processing unit 100 and performs a print process with a printer (not shown).

The data communication unit 101 receives commands and data from the information processing unit 100 through the local bus 104, transmits them to the information processing apparatus 2 in conformity with a predetermined protocol, and transmits conversely commands and data that are received from the information processing apparatus 2 to the information processing unit 100. In this embodiment, the data communication unit 101 receives parallel data from the information processing unit 100 through the local bus 104, converts into high-speed serial data a part of the received data at a timing of the predetermined protocol, and outputs them to the connector 110 and 120 as differential signals. Moreover, the data communication unit 101 receives the high-speed serial data through the connectors 110 and 120 and the buses 102 and 103, converts into parallel data the received data at a timing of the predetermined protocol, and transmits the data to the information processing unit 100.

The data communication unit 201 receives commands and data from the information processing unit 200 through the local bus 204 and transmits them to the information processing apparatus 1 in conformity with the predetermined protocol. Moreover, the data communication unit 201 transmits the command and data that are received from the information processing apparatus 1 to the information processing unit 200 at a timing of the predetermined protocol.

In this embodiment, the data communication unit 201 receives the parallel data from the information processing unit 200 through the local bus 204, converts into the high-speed serial data a part of the received data, and outputs them to the connectors 210 and 220 as differential signals. Moreover, the data communication unit 201 receives the high-speed serial data through the connectors 210 and 220 and the buses 202 and 203, converts into parallel data the received data at a timing of the predetermined protocol, and transmits the data to the information processing unit 200.

The buses 102 and 103 respectively connect the data communication unit 101 with the connectors 110 and 120. Similarly, the buses 202 and 203 respectively connect the data communication unit 201 with the connectors 210 and 22. The high-speed serial data transmitted and received through the buses 102, 103, 202, and 203 conform to a communication standard like LVDS (Low voltage differential signaling), for example, but it is not limited to this.

The local bus 104 connects the information processing unit 100 with the data communication unit 101, and the local bus 204 connects the information processing unit 200 with the data communication unit 201. When the information processing apparatus 1 has a second data communication unit (not shown), the second data communication unit may be also connected through the local bus 104. The information processing apparatus 2 can employ the similar configuration.

The signal fixing circuits 105 and 106 are grounded through resistors or are connected to a predetermined power source and respectively fix signal levels of the buses 102 and 103 to a LOW level or a HIGH level when they are driven by the data communication unit 101 or when the cables 3 and 4 are not connected. Similarly, the signal fixing circuits 205 and 206 are grounded through resistors or are connected to the predetermined power source and respectively fix signal levels of the buses 202 and 203 to a LOW level or a HIGH level when they are driven by the data communication unit 101 or when the cables 3 and 4 are not connected.

The connectors 110, 120, 210, and 220 are identical in the number and arrangement of terminals and have the same shape. The connectors 110 and 120 connect the information processing apparatus 1 with an external device. The connectors 210 and 220 connect the information processing apparatus 2 with an external device. The information processing apparatus 2 is seen as an external device from the information processing apparatus 1. And the information processing apparatus 1 is seen as an external device from the information processing apparatus 2.

The cables 3 and 4 connect the information processing apparatus 1 and the information processing apparatus 2 so as to be communicable. The cable 3 has connectors (not shown) at both ends so as to connect with the connectors 110 and 210. The cable 4 also has connectors (not shown) at both ends so as to connect with the connectors 120 and 220. The cables 3 and 4 conform to the same communication standard. The connectors (not shown) of the cables 3 and 4 are identical in the number and arrangement of terminals in accordance with the configuration of the connectors 110, 120, 210, and 220 and have the same shape. That is, the cables 3 and 4 are the approximately same cables.

In this embodiment, a state where the connectors 110 and 210 are connected through a cable and the connectors 120 and 220 are connected through a cable shall be a state where the information processing apparatus 1 correctly connects with the information processing apparatus 2. In other words, a state where the connectors 110 and 220 are connected through a cable and the connectors 120 and 210 are connected through a cable shall be an erroneous connection (reverse connection) state. In the erroneous connection state, the information processing apparatuses 1 and 2 shall not perform normal communication.

FIG. 2A is a schematic view showing a terminal arrangement of the connector 110 of the information processing apparatus 1 and signals allocated to terminals viewed from the information processing unit 100. A terminal arrangement of the connector 210 of the information processing apparatus 2 is the same as the terminal arrangement of the connector 110. FIG. 2B is a schematic view showing a terminal arrangement of the connector 120 of the information processing apparatus 1 and signals allocated to terminals viewed from the information processing unit 100. A terminal arrangement of the connector 220 of the information processing apparatus 2 is the same as the terminal arrangement of the connector 120. In this embodiment, each of the connectors 110, 120, 210, and 220 has twenty terminals as with a type of cable conforming with a display port standard, but the number of terminals is not limited to this.

In FIG. 2A and FIG. 2B, rectangles (squares) in which the serial numbers (1 through 40) are given show the terminals, and the serial numbers given inside are terminal numbers. Moreover, patterns (hatchings) given to squares show types of signals as shown in FIG. 2A and FIG. 2B. That is, a dot pattern (for example, a No. 2 terminal) indicates a terminal connected to GND (ground). A fine slash pattern (for example, a No. 3 terminal) indicates a terminal that transmits a receiving differential signal. A coarse slash pattern (for example, a No. 6 terminal) indicates a terminal that transmits a transmitting differential signal. A shading pattern (for example, a No. 22 terminal) indicates an unconnected terminal. A blank (for example, a No. 1 terminal) indicates a terminal that transmits other signals.

Symbols "1→2" and "2→1" shown in FIG. 2A and FIG. 2B indicate transmission directions of signals. Symbols "RX0", "RX1", "TX0" through "TX7" shown in FIG. 2A and FIG. 2B indicate terminal groups. Each group consists of differential signals and GND.

The No. 1 terminal of the connector (second connector) 110 is allocated to transmission of a TX_RDY signal (a signal notifying start-up of the information processing apparatus 1) showing that the communication preparation in the information processing apparatus 1 is ready to the external device. An N.C. signal showing that it is not connected is assigned to the No. 22 terminal (second terminal). A No. 11 terminal of the connector (first connector) 120 of which the position corresponds to the No. 1 terminal of the connector 110 is allocated to an N.C. signal. Moreover, a No. 32 terminal (first terminal) of the connector 120 of which the position corresponds to the No. 22 terminal of the connector 110 is allocated to reception of an RX_RDY signal (a predetermined signal output according to start-up of the external device (the information processing apparatus 2)) showing that the communication preparation in the information processing apparatus 2 is ready. Then, a PWR signal for controlling a power source is assigned to a No. 40 terminal.

Since the cables 3 and 4 are the approximately same cables as mentioned above, the connector 110 and the connector 220 may be erroneously connected, for example. In order not to cause an electric short circuit, safety is secured by employing a configuration that matches terminal directions of the connectors 110 and 120 or that disconnects one of the connectors 110 and 120. The same configuration is employed for the connectors 210 and 220.

Figure 3:
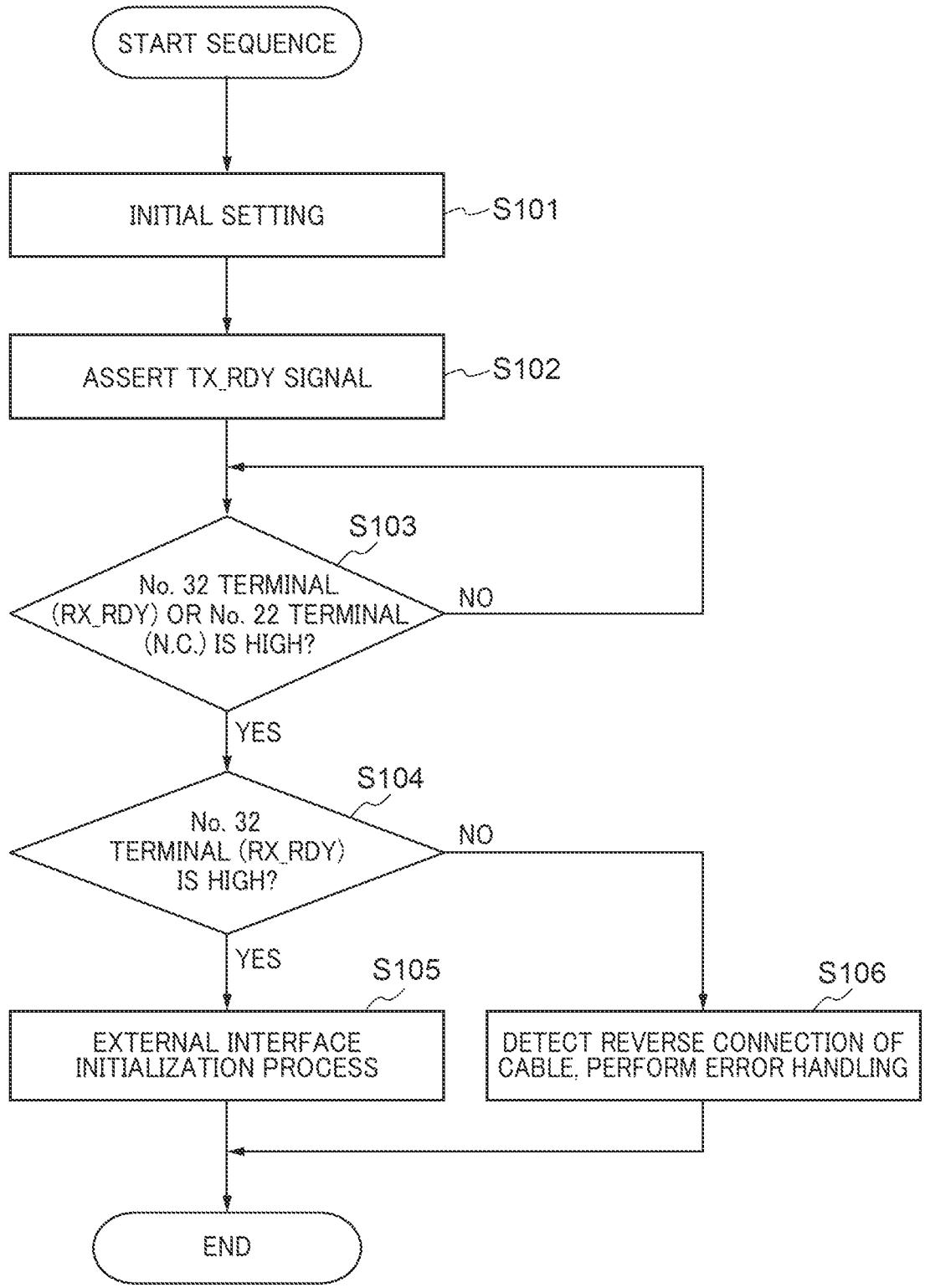
FIG. 3 is a flowchart showing a process that detects correction of cable connection in the first information processing apparatus.

Next, a process that the information processing apparatus 1 detects whether the cables 3 and 4 are correctly connected to the information processing apparatuses 1 and 2 will be described. FIG. 3 is a flowchart showing the process that detects correction of cable connection in the information processing apparatus 1. Each process (step) shown by an S-number in the flowchart in FIG. 3 is achieved when the CPU of the information processing unit 100 runs a predetermined program.

When power is applied to the information processing apparatus 1 due to an ON operation given to a power switch (not shown) provided in the information processing apparatus 1, electric power is supplied to the information processing unit 100, the data communication unit 101, and circuits (not shown), and the process in FIG. 3 is started.

In S101, the information processing unit 100 (CPU) performs an initial setting process. For example, the signal fixing circuit 105, which is connected to the buses 102 and 103, fixes a certain signal so as to show HIGH by a pull-up resistor or to show LOW by a pull-down resistor. In this example, the TX_RDY signal, RX_RDY signal, and N.C. signal shall be fixed to the LOW level in the initial state. It should be noted that the signal fixing circuit 105 shall fix a LOW active signal to an inactive state (i.e., a HIGH level) in the initial state. When a clock is stably supplied to internal circuits from a PLL (not shown) after a predetermined time elapses, initializations of the internal circuits are completed (reset release) and the information processing apparatus 1 becomes communicable with the information processing apparatus 2.

In S102, the information processing unit 100 asserts (drives) the TX_RDY signal of the No. 1 terminal of the connector 110 to the HIGH level. Thereby, the information processing apparatus 1 notifies the information processing apparatus 2 that the communication preparation has been completed.

In S103, the information processing unit 100 determines whether the RX_RDY signal is received from the information processing apparatus 2. Specifically, the information processing unit 100 determines whether the signal of the No. 22 terminal of the connector 110 or the signal of the No. 32 terminal of the connector 120 varies to the HIGH level from the LOW level. When determining that both the signal of the No. 22 terminal and the signal of the No. 32 terminal keep the LOW level (No in S103), the information processing unit 100 determines that the communication preparation in the information processing apparatus 2 is not completed and repeats the determination in S103. Then, when determining that the signal of the No. 22 terminal or the signal of the No. 32 terminal varies to the HIGH level from the LOW level (Yes in S103), the information processing unit 100 proceeds with the process to S104.

In S104, the information processing unit 100 determines whether the signal of the No. 32 terminal of the connector 120 becomes the HIGH level. When the communication preparation is completed, the information processing unit 200 of the information processing apparatus 2 switches the RX_RDY signal to the HIGH level from the LOW level. Accordingly, when the information processing apparatuses 1 and 2 are correctly connected through the cables 3 and 4, the signal that is received by the No. 32 terminal of the connector 120 varies to the HIGH level from the LOW level (see FIG. 2B). Accordingly, when determining that the signal of the No. 32 terminal of the connector 120 becomes the HIGH level (Yes in S104), the information processing unit 100 determines that the cables 3 and 4 are correctly connected and proceeds with the process to S105. In S105, the information processing unit 100 performs an initialization process of an external interface (not shown) that manages the communication with the information processing apparatus 2.

In the meantime, when the cables 3 and 4 are erroneously connected to the information processing apparatuses 1 and 2, the signal level of the No. 22 terminal of the connector 110 varies to the HIGH level from the LOW level. This is further described by referring to FIG. 4A and FIG. 4B.

FIG. 4A is a schematic view showing relations between terminals and signals of the connector 110 viewed from the information processing unit 200 in a case where the cables 3 and 4 are conversely connected. FIG. 4B is a schematic view showing relations between terminals and signals of the connector 120 viewed from the information processing unit 200 in the case where the cables 3 and 4 are conversely connected. When the cables 3 and 4 are conversely connected, a No. 32 terminal of the connector 220 is connected to the No. 22 terminal of the connector 110, and a No. 22 terminal of the connector 210 is connected to the No. 32 terminal of the connector 120.

The N.C. signal is allocated to the No. 22 terminal of the connector 110 as shown in FIG. 2A. When the cables 3 and 4 are conversely connected, the No. 22 terminal of the connector 210 is connected to the No. 32 terminal of the connector 120. In this case, since the N.C. signal is never driven when the communication preparation is ready in the information processing apparatus 2, the signal level of the No. 32 terminal of the connector 120 is fixed to the LOW level by the signal fixing circuit 105 and does not become the HIGH level.

In the meantime, the RX_RDY signal is allocated to the No. 32 terminal of the connector 120 as shown in FIG. 2B. When the cables 3 and 4 are conversely connected, the No. 32 terminal of the connector 220 is connected to the No. 22 terminal of the connector 110. In this case, when the communication preparation is ready in the information processing apparatus 2, the RX_RDY signal is driven and is switched to the HIGH level from the LOW level. As a result, the signal level of the No. 22 terminal of the connector 110 varies to the HIGH level from the LOW level. Accordingly, when determining that the signal of the No. 22 terminal of the connector 110 becomes the HIGH level (No in S104), the information processing unit 100 determines that the cables 3 and 4 are conversely connected and proceeds with the process to S106. In S106, the information processing unit 100 performs an error handling.

In this way, the information processing unit 100 can determine whether the cables 3 and 4 are correctly connected using the configuration of the connectors 110 and 120 configured so that a terminal of which a signal level becomes the HIGH level will vary depending on the connection state of the cables 3 and 4.

Figure 5:
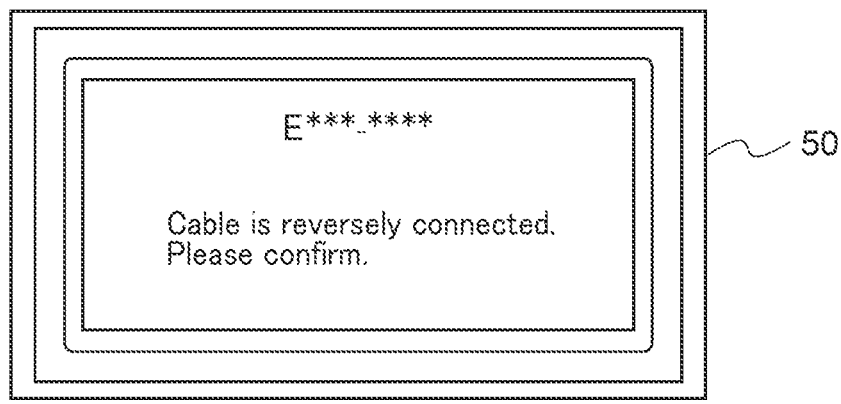
FIG. 5 is a view showing an example of an error message displayed in error handlings in S106 in FIG. 3 and S206 in FIG. 7.

FIG. 5 is a view showing an example of an error message 50 that is displayed by the information processing unit 100 in the error handling in S106. For example, the information processing apparatus 1 can notify a user of an error by displaying the error message 50 on a display unit (not shown) of the information processing apparatus 1. An error notification method to a user is not limited to the display of an error message on the display unit. A method by sounding a buzzer or a method of voice announcement of the error message 50 may be employed. A plurality of methods may be performed simultaneously.

When the information processing unit 100 finishes this process after the process in S105, the information processing apparatuses 1 and 2 are able to transmit and receive commands and data according to a predetermined protocol. In the meantime, when the information processing unit 100 finishes this process after the process in S106, the information processing apparatuses 1 and 2 are not able to transmit and receive commands and data.

The initialization process executed by the information processing apparatus 1 in S105 in FIG. 3 transmits a predetermined clock to perform high-speed serial data communication and detects whether a PLL of a reception unit is locked by the No. 30 terminal or transmits and receives a specific pulse signal to compare. Since initialization of high-speed serial data communication and transmission of commands and data can be performed using well-known techniques, their descriptions are omitted.

Moreover, although the TX_RDY signal is asserted in S102 to be switched to the HIGH level in this embodiment, another method may be employed. For example, the TX_RDY signal may be connected using the signal fixing circuit 105 through a pull-up resistor so that the TX_RDY signal will become the HIGH level when the power of the information processing apparatus 1 will be turned ON.

Next, a process that the information processing apparatus 2 detects whether the cables 3 and 4 are correctly connected to the information processing apparatuses 1 and 2 will be described. At the beginning, terminal arrangements of the connectors 210 and 220, and signals allocated to terminals will be described. FIG. 6A is a schematic view showing a terminal arrangement of the connector 210 of the information processing apparatus 2 and signals allocated to terminals viewed from the information processing unit 200. FIG. 6B is a schematic view showing a terminal arrangement of the connector 220 of the information processing apparatus 2 and signals allocated to terminals viewed from the information processing unit 200.

Symbols "1→2" and "2→1" shown in FIG. 6A and FIG. 6B indicate transmission directions of signals between the information processing apparatuses 1 and 2 as with FIG. 2A and FIG. 2B. The connector 210 differs from the connector 110 in that the transmission directions of the signals are reversed. The connector 220 differs from the connector 120 in that the transmission directions of the signals are reversed. That is, the TX_RDY signal is allocated to the No. 1 terminal of the connector 210, and the N.C. signal is allocated to the No. 22 terminal. Moreover, the N.C. signal is allocated to the No. 11 terminal of the connector 220, and the RX_RDY signal is allocated to the No. 32 terminal. The PWR signal for controlling the power source is allocated to the No. 40 terminal. Symbols "RX0", "RX1", "TX0" through "TX7" shown in FIG. 6A and FIG. 6B indicate terminal groups. Each group consists of differential signals and GND.

Figure 7:
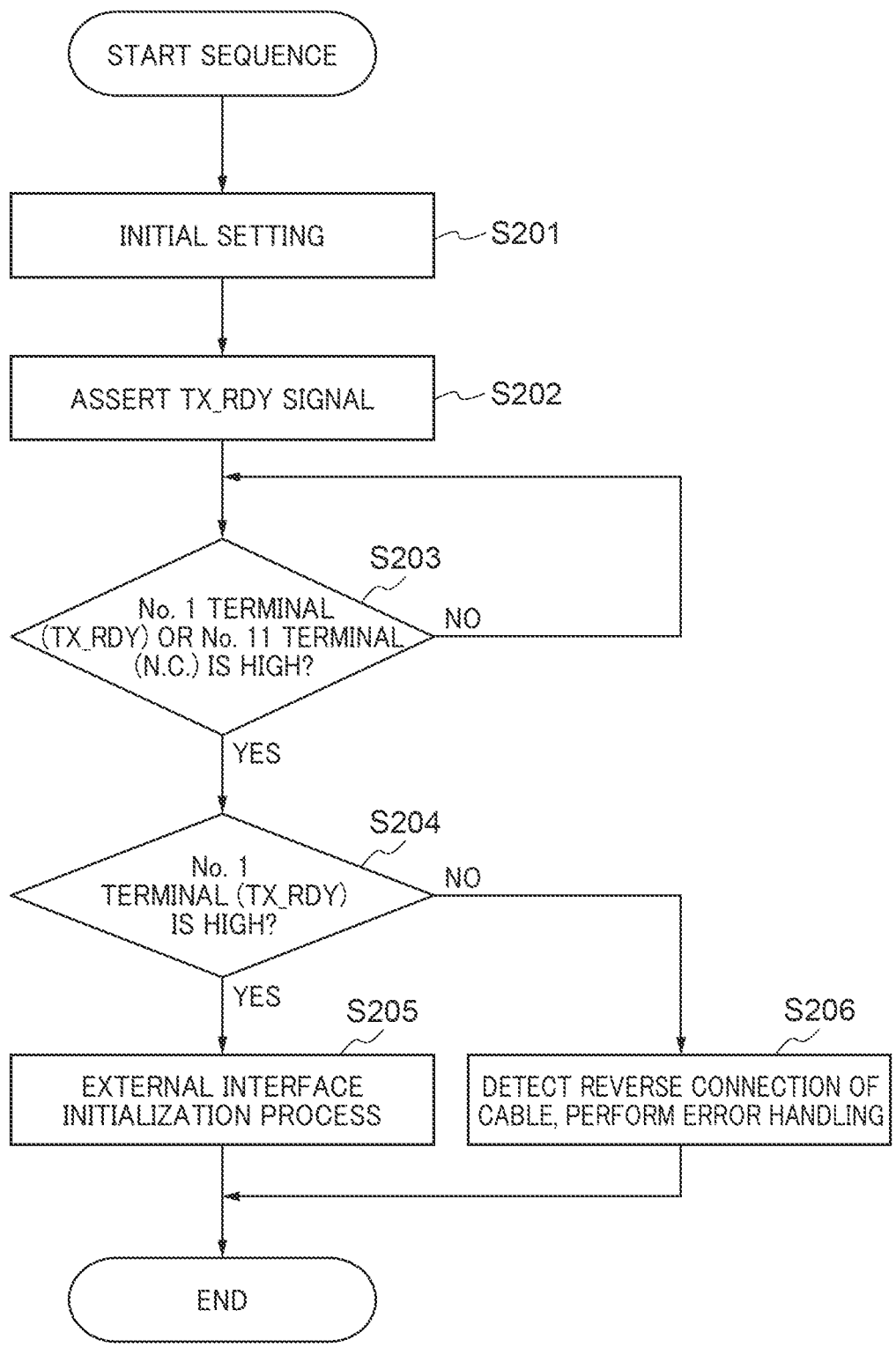
FIG. 7 is a flowchart showing a process that detects correction of cable connection in the second information processing apparatus.

FIG. 7 is a flowchart showing a process executed by the information processing apparatus 2 that detects whether the cables 3 and 4 are correctly connected to the information processing apparatuses 1 and 2. Each process (step) shown by an S-number in the flowchart in FIG. 7 is achieved when the CPU of the information processing unit 200 runs a predetermined program.

When power is applied to the information processing apparatus 2 due to an ON operation given to a power switch (not shown) provided in the information processing apparatus 2, electric power is supplied to the information processing unit 200, the data communication unit 201, and circuits (not shown), and the process in FIG. 7 is started.

Although a process in S201 is executed by the information processing apparatus 2 and the process in S101 is executed by the information processing apparatus 1, the contents of the processes are identical. Accordingly, its description is omitted. It should be noted that the TX_RDY signal, RX_RDY signal, and N.C. signal shall be fixed to the LOW level in an initial state.

In S202, the information processing unit 200 asserts (drives) the RX_RDY signal of the No. 32 terminal of the connector 210 to the HIGH level. Thereby, the information processing apparatus 2 notifies the information processing apparatus 1 that the communication preparation has been completed.

In S203, the information processing unit 200 determines whether the TX_RDY signal is received from the information processing apparatus 1. Specifically, the information processing unit 200 determines whether the signal of the No. 1 terminal of the connector 210 or the signal of the No. 11 terminal of the connector 220 varies to the HIGH level from the LOW level. When determining that both the signal of the No. 1 terminal and the signal of the No. 11 terminal keep the LOW level (No in S203), the information processing unit 200 determines that the communication preparation in the information processing apparatus 1 is not completed and repeats the determination in S203. Then, when determining that the signal of the No. 1 terminal or the signal of the No. 11 terminal varies to the HIGH level from the LOW level (Yes in S203), the information processing unit 200 proceeds with the process to S204.

In S204, the information processing unit 200 determines whether the signal of the No. 1 terminal of the connector 210 becomes the HIGH level. When the communication preparation is completed, the information processing unit 100 of the information processing apparatus 1 switches the TX_RDY signal to the HIGH level from the LOW level. Accordingly, when the information processing apparatuses 1 and 2 are correctly connected through the cables 3 and 4, the signal that is received by the No. 1 terminal of the connector 210 varies to the HIGH level from the LOW level (see FIG. 6A).

In the meantime, when the cables 3 and 4 are erroneously connected to the information processing apparatuses 1 and 2, the received signal of the No. 11 terminal of the connector 220 varies to the HIGH level from the LOW level. Accordingly, when determining that the signal of the No. 1 terminal becomes the HIGH level (Yes in S204), the information processing unit 200 determines that the cables 3 and 4 are correctly connected and proceeds with the process to S205.

In S205, the information processing unit 200 performs an initialization process of an external interface (not shown) that manages the communication with the information processing apparatus 1. In the meantime, when determining that the signal of the No. 1 terminal becomes the HIGH level (No in S204), the information processing unit 200 determines that the cables 3 and 4 are conversely connected and proceeds with the process to S206. In S206, the information processing unit 200 performs the error handling. Since the contents of the error handling in S206 are equivalent to the contents of the error handling in S106, their descriptions are omitted.

It should be noted that the RX_RDY signal is asserted in S202 in this example. However, the embodiment is not limited to this example. For example, the RX_RDY signal may be connected using the signal fixing circuit 205 through a pull-up resistor so that the RX_RDY signal will become the HIGH level when the power of the information processing apparatus 2 will be turned ON.

Although the present invention has been described in detail on the basis of the suitable embodiments, the present invention is not limited to these specific embodiments, and various configurations that do not deviate from the scope of the present invention are also included in the present invention. Furthermore, each embodiment mentioned above shows one embodiment of the present invention, and the embodiments can be combined suitably.

Figure 8:
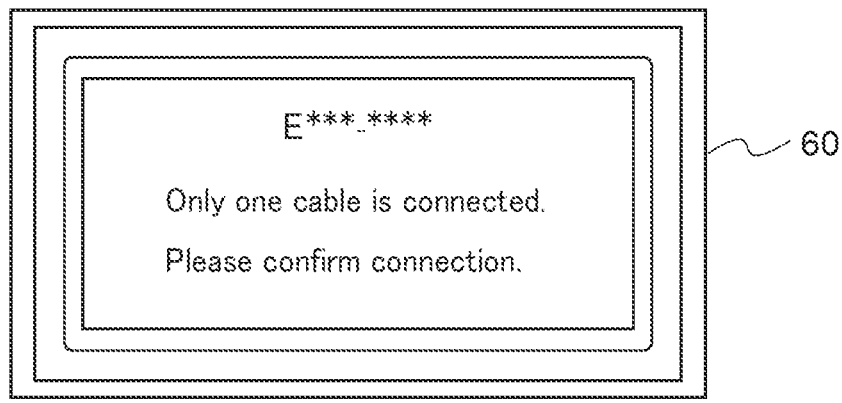
FIG. 8 is a view showing an example of an error message displayed when timeout errors occur in S103 in FIGS. 3 and S203 in FIG. 7.

For example, the above-mentioned embodiment has been described under the presumption that the connectors 110 and 120 of the information processing apparatus 1 and the connectors 210 and 220 of the information processing apparatus 2 are connected through the cables 3 and 4 irrespective of correction of connections. Against this, when only one cable is connected, the communication between the information processing apparatuses 1 and 2 may not be established. In such a case, the system may be configured so that a timeout error results when a predetermined period elapses in S103 and S203 while the signal of the above-mentioned predetermined terminal keeps the LOW level. FIG. 8A shows an example of an error message 60 displayed on display units (not shown) of the information processing apparatuses 1 and 2 when only one cable is connected. Furthermore, also in this case, sound (voice) warning may be used in place of the error message 60 or the sound warning may be used together with the display of the error message 60.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-086105, filed May 21, 2021, which is hereby incorporated by reference herein in its entirety.

What is claimed is:

1. An information processing apparatus capable of communicating with an external device via two cables, the information processing apparatus comprising:
a first connector that is connected to one of the two cables and that has terminals, which include one or more ground terminals and one or more high-speed communication differential signal terminals and a first terminal, separate from one or more ground terminals and one or more high-speed communication differential signal terminals, and that is arranged at a first position and receives a predetermined signal output according to start-up of the external device and are arranged in a predetermined arrangement;
a second connector of a same shape as the first connector that is connected to another of the two cables and that has terminals, which are identical to the terminals of the first connector in number and arrangement and include a second terminal, separate from one or more ground terminals and one or more high-speed communication differential signal terminals of the second connector, and that is not used to output a signal and is arranged at a position corresponding to the first terminal;
a notification device configured to notify of information; and
at least one controller configured to notify of a message indicating that a cable of the two cables is reversely connected through the notification device in a case where the second terminal receives the predetermined signal.

2. The information processing apparatus according to claim 1, wherein the at least one controller determines that the first connector and the second connector are erroneously connected to the external device in a case where a signal level of the second terminal varies and a signal level of the first terminal does not vary, and
wherein the at least one controller determines that the first connector and the second connector are correctly connected to the external device in a case where the signal level of the first terminal varies and the signal level of the second terminal does not vary.

3. The information processing apparatus according to claim 2, wherein variation of a signal level of the first terminal or a signal level of the second terminal is variation to a HIGH level from a LOW level.

4. The information processing apparatus according to claim 2, wherein variation of a signal level of the first terminal or a signal level of the second terminal is variation to a LOW level from a HIGH level.

5. The information processing apparatus according to claim 1, wherein the at least one controller notifies of the message through the notification device in a case where it is determined that the first connector and the second connector are erroneously connected to the external device.

6. The information processing apparatus according to claim 2, wherein the at least one controller determines that the first connector is not connected to the external device in a case where the signal level of the first terminal and the signal level of the second terminal do not vary within a predetermined period after transmitting a signal notifying start-up of the information processing apparatus to the external device.

7. The information processing apparatus according to claim 6, wherein the at least one controller notifies of the message through the notification device in a case where it is determined that the first connector is not connected to the external device.

8. The information processing apparatus according to claim 1, wherein the predetermined signal output from the external device notifies the information processing apparatus that communication preparation in the external device is ready.

9. A control method for an information processing apparatus that is capable of communicating with an external device via two cables and that includes, a first connector that is connected to one of the two cables and that has terminals, which include one or more ground terminals and one or more high-speed communication differential signal terminals and a first terminal, separate from one or more ground terminals and one or more high-speed communication differential signal terminals, and that is arranged at a first position and receives a predetermined signal output according to start-up of the external device and are arranged in a predetermined arrangement, and a second connector of a same shape as the first connector that is connected to another of the two cables and that has terminals, which are identical to the terminals of the first connector in number and arrangement and include a second terminal, separate from one or more ground terminals and one or more high-speed communication differential signal terminals of the second connector, and that is not used to output a signal and is arranged at a position corresponding to the first terminal, the control method comprising:
determining whether the second terminal receives the predetermined signal; and
notifying of a message indicating that a cable of the two cables is reversely connected in a case where it is determined that the second terminal receives the predetermined signal.

* * * * *